United States Patent
Kaneko et al.

(10) Patent No.: US 7,585,117 B2
(45) Date of Patent: Sep. 8, 2009

(54) OPTICAL MODULE

(76) Inventors: Taro Kaneko, c/o NEC Corporation, 7-1, Shiba 5-chome, Minato-ku, Tokyo (JP); Masaaki Nido, c/o NEC Corporation, 7-1, Shiba 5-chome, Minato-ku, Tokyo (JP); Isao Tomita, c/o NEC Corporation, 7-1, Shiba 5-chome, Minato-ku, Tokyo (JP)

(*) Notice: Subject to any disclaimer, the term of this patent is extended or adjusted under 35 U.S.C. 154(b) by 0 days.

(21) Appl. No.: 12/016,300

(22) Filed: Jan. 18, 2008

(65) Prior Publication Data

US 2008/0187268 A1 Aug. 7, 2008

(30) Foreign Application Priority Data

Feb. 7, 2007 (JP) .............................. 2007-028588

(51) Int. Cl.
  *G02B 6/12* (2006.01)
  *G02B 6/26* (2006.01)
  *G02B 6/42* (2006.01)
(52) U.S. Cl. .............................. 385/88; 385/14; 385/32
(58) Field of Classification Search .................. None
  See application file for complete search history.

(56) References Cited

U.S. PATENT DOCUMENTS

| 5,068,865 | A | * | 11/1991 | Ohshima et al. | ............... | 372/36 |
| 2002/0048297 | A1 | * | 4/2002 | Irie et al. | ....................... | 372/36 |
| 2007/0110453 | A1 | * | 5/2007 | Akiyama et al. | ............ | 398/182 |

FOREIGN PATENT DOCUMENTS

| EP | 1708323 | A2 | 10/2006 |
| GB | 2376532 | A | 12/2002 |
| JP | 62-82761 | U | 5/1987 |
| JP | 2004288669 | A | * | 10/2004 |

OTHER PUBLICATIONS

European Search Report for Application No. EP08002058, search completed date May 8, 2008.
T.K. Chekhlova et al., "Temperature-Independent Waveguide Spectral Mutliplexers/Demultiplexers" Journal of Russian Laser Research, Kluwer Academic Publishers-Plenum Publishers, NE, vol. 26, No. 3, May 1, 2003, pp. 198-210.
A. Melloni et al., "Experimental Evaluation of Ring Resonator Filters Impact on the Bit Error Rate in Non Return to Zero Transmission Systems", Optics communications, North-Holland Publishing Co., Amsterdam, NL., vol. 234, No. 1-6, Apr. 15, 2004, pp. 211-216.
Senichi Suzuki et al., "Integrated Multichannel Optical Wavelength Selective Switches Incorporating an Arrayed-Waveguide Grating Multiplexer and Thermooptic Switches", Journal of Lightwave Technology, IEEE Service Center, new York, NY, US, vol. 16, No. 4, Apr. 1, 1998, pp. 650-655.

* cited by examiner

*Primary Examiner*—Michelle R Connelly Cushwa

(57) ABSTRACT

Distortion of the temperature control element and the package by thermal deformation or mechanical deformation is prevented from being transmitted to the optical element as stress, and at the same time, constant temperature control of the optical element is realized. An optical element unit including an optical element that requires temperature control and an optical component that does not require temperature control, and a temperature control element for performing temperature adjustment of the optical element are arranged. The temperature control element performs temperature adjustment control of the optical element through a region mounted with the optical component of the optical element unit.

12 Claims, 6 Drawing Sheets

OPTICAL MODULE

CROSS-REFERENCE TO RELATED APPLICATION

This application is based upon and claims the benefit of priority from Japanese patent application No. 2007-028588, filed on Feb. 7, 2007, the disclosure of which is incorporated herein in its entirety by reference.

BACKGROUND OF THE INVENTION

1. Field of the Invention

The present invention relates to an optical module used in an optical fiber communication.

2. Description of the Related Art

In a high-speed, large-capacity optical communication system, a wavelength division multiplex communication (D-WDM) has been adopted for the trunk line optical communication system. With this, there has been a need for an optical module in which high precision wavelength control required for the D-WDM can be realized. In the D-WDM optical module, an optical element is operated at a constant temperature using a temperature control element to suppress fluctuation in various properties of the optical element caused by environmental temperature variation.

In such an optical module, a device equipped with a Peltier element which is a temperature control element is disclosed in Japanese Laid-Open Utility Model Publication No. 62-82761 (Patent document 1). The device disclosed in Patent document 1 keeps the temperature of the laser element constant through a substrate and suppresses change in wavelength caused by temperature variation, and furthermore, maintains the change in distance between the laser element and the lens caused by external temperature variation to be small.

However, the Peltier element functions as a heat exchanger and is normally configured by sandwiching with two plates so that one surface is to be HOT and the other surface is to be COLD, where there is an inherent problem in that warp occurs due to temperature difference between the two plates in the Peltier element having a sandwich configuration with two plates.

Thus, when the Peltier element is operated, though the temperature of the optical element is kept constant, stress is applied on the optical element due to deformation of the Peltier element. The stress is also applied on the optical element due to thermal distortion or mechanical distortion of the package. When the optical element is subjected to stress, various properties of the optical element tend to change.

In the device disclosed in patent document 1, the Peltier element is arranged up to the position of a bottom surface of the substrate, corresponding to the portion for an external resonator, from the end face of the laser element to the reflection film surface of the lens, and thus stress caused by a warpage of the Peltier element is applied to the portion corresponding to the external resonator. In such configuration, the laser element and the external resonator can be operated at a constant temperature, but the stress applied to the external resonator cannot be controlled sufficiently. If the control of the stress applied to the external resonator is insufficient, the resonance wavelength changes, and high precision wavelength control cannot be expected.

SUMMARY OF THE INVENTION

Therefore, it is an exemplary object of the invention to improve the disadvantages of the related art, and to provide an optical module having a configuration which realizes an alleviation of external stress dependency of the optical element characteristics and an appropriate control to keep the temperature of the optical element constant simultaneously by obtaining a configuration in which distortion of the temperature control element or package caused by thermal deformation or mechanical deformation is not transmitted to the optical element as a stress.

In order to achieve the above object, an exemplary aspect of the optical module according to the invention includes an optical element unit including an optical element that requires temperature control and an optical component that does not require temperature control, and a temperature control element for performing adjustment of the temperature of the optical element, where the temperature control element performs adjustment control of the temperature of the optical element through a region where the optical component of the optical element unit is mounted.

As an exemplary advantage according to the invention, a distortion of the temperature control element and the package caused by thermal deformation or mechanical deformation is not transmitted to the optical element as a stress, whereby the alleviation of the external stress dependency of the optical element characteristics and the appropriate control to keep the temperature of the optical element unit constant can be simultaneously realized.

DETAILED DESCRIPTION OF THE EXEMPLARY EMBODIMENTS

The exemplary embodiments of the present invention will now be described in detail based on the drawings.

As shown in FIGS. 1 to 6, the optical module according to the exemplary embodiment of the present invention includes an optical element unit (7, 47) including an optical element (2, 42, 43) that requires temperature control and optical components (4, 5, 44); and a temperature control element (8, 52) for performing adjustment of the temperature of the optical element, where the temperature control element performs temperature adjustment control of the optical element through a region mounted with the optical components of the optical element unit.

In the exemplary embodiment of the present invention, since the temperature control element performs temperature adjustment control of the optical element through the region mounted with the optical components of the optical element unit, the temperature control element does not directly contact the optical components, and the optical components can be avoided from being subjected to distortion caused by thermal deformation of the temperature control element. Furthermore, since the temperature control element performs temperature adjustment control of the optical element through the region mounted with the optical components of the optical element unit, the optical element, which is a heat generating source, can be avoided from being influenced by heat.

The exemplary embodiments of the present invention will now be described in further detail using specific examples.

First Exemplary Embodiment

Figure 1A:
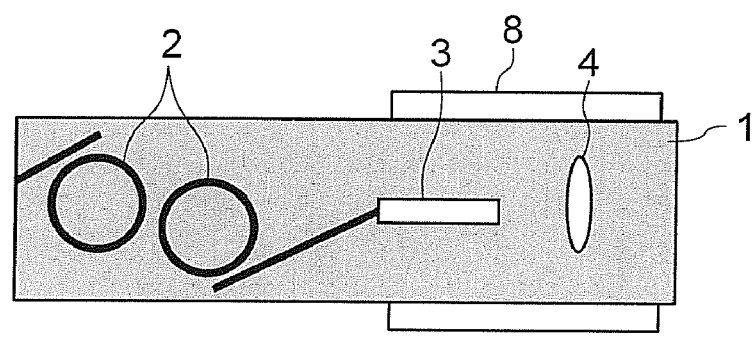
FIG. 1A is a plan view showing a configuration of an optical module according to a first exemplary embodiment of the present invention.
Figure 1B:
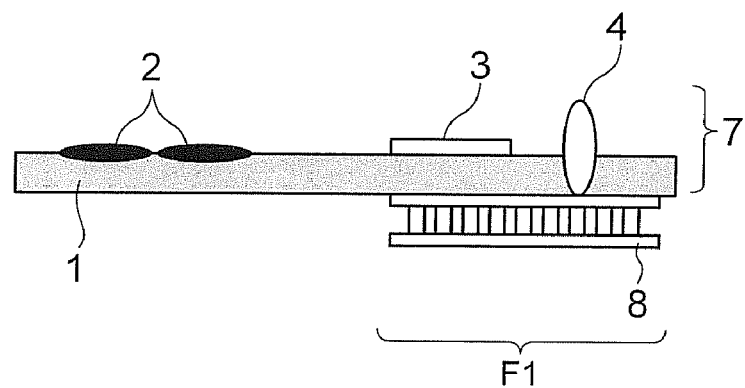
FIG. 1B is a front view showing the configuration of the optical module according to the first exemplary embodiment of the present invention.

FIG. 1A is a plan view showing a configuration of an optical module according to a first exemplary embodiment of the present invention, and FIG. 1B is a front view showing a configuration of the optical module according to the first exemplary embodiment of the present invention.

In the optical module of FIG. 1, an optical element unit 7 is formed by hybrid integration of an external resonator 2 configured by a PLC (Planar Lightwave Circuit) 1, an SOA element 3 serving as an optical amplifier, and a lens 4 for coupling the light from the SOA element 3 on an optical fiber, on a heat conductive carrier 6. The optical element unit 7 has a configuration of a wavelength tunable light source module.

The ring resonator (external resonator 2) of PLC is a wavelength filter which is compact and excels in mass productivity, and functions as a wavelength tunable filter by controlling the temperature of the ring of the ring resonator with a heater. It is a well-known fact that its equivalent refractive index changes when stress is applied to the PLC, and it is known that the resonance wavelength fluctuates due to the stress applied on the PLC when the wavelength tunable filter is configured by the PLC.

Generally, the optical element unit 7 is temperature controlled by a Peltier element 8, which is one type of temperature control element. The Peltier element 8 functions as a heat exchanger and is normally configured by sandwiching with two plates as shown in FIGS. 1A and 1B so that one surface is to be HOT (warm) and the other surface is to be COLD (cold) (an element having such an overall sandwich configuration with two plates is hereinafter referred to as a Peltier element). Since temperature difference is created between the two plates of the Peltier element 8, there is an inherent problem that warpage occurs.

In the optical element unit 7 shown in FIGS. 1A and 1B, the external resonator 2 is an element that requires temperature control, and the SOA element 3 and the lens 4 are optical components.

For wavelength control, the PLC wavelength tunable filter (external resonator 2) needs to be operated at a constant temperature, so the PLC is solder-mounted on the Peltier element 8, a thermistor is attached on the PLC, and heating or cooling is performed with the Peltier element while monitoring the temperature with the thermistor. However, since the Peltier element is a heat exchanger, the temperature difference between the two plates of the Peltier element 8 varies when the environmental temperature varies, whereby the warping amount of the Peltier element also varies. Thus, the amount of stress applied on the PLC varies due to environmental temperature variation and the resonance wavelength also varies. This has been the problem in the wavelength tunable light source module where high precision wavelength control is demanded.

In the optical module according to the first exemplary embodiment of the present invention, the Peltier element 8 is arranged only at a region F1 mounted with the optical components of the optical element unit 7, so that the Peltier element 8 performs temperature control of the optical element 2 through the region F1 mounted with the optical components of the optical element unit 7, as shown in FIGS. 1A and 1B.

In the first exemplary embodiment of the present invention, the Peltier element 8 does not directly contact the external resonator 2. Even if the Peltier element 8 is deformed by the temperature difference between hot and cold, the distortion caused by thermal deformation does not influence the external resonator 2, and influence of warp of the Peltier element 8 can be blocked off. Furthermore, since the Peltier element 8 contacts only the region F1 mounted with the optical components of the optical element module, temperature control can be performed even when cooling the external resonator 2 by cooling the external resonator 2 through the region F1 of the optical element unit 7, and thus suppression of fluctuation in resonance wavelength and constant temperature control can be simultaneously realized.

Second Exemplary Embodiment

The PLC 1 shown in FIGS. 1 and 2 is obtained by forming a glass thin film on a substrate such as Si having a thickness of about 1 mm. Since the light exit position is about 1 mm from the bottom surface of the substrate, it is difficult to mount optical components such as a large lens 4 and an isolator 5 on the PLC 1 as shown in FIG. 2. Furthermore, since the substrate of the PLC is thin, which is about 1 mm, and the heat resistance of the ring resonator 2 which is the heat generating source, and the Peltier element 8, are large, constant temperature control under a high temperature environment becomes difficult when the heat value of the ring resonator 2 is large. The isolator 5 transmits the light output from the SOA element 3 only in the optical fiber direction.

Figure 2A:
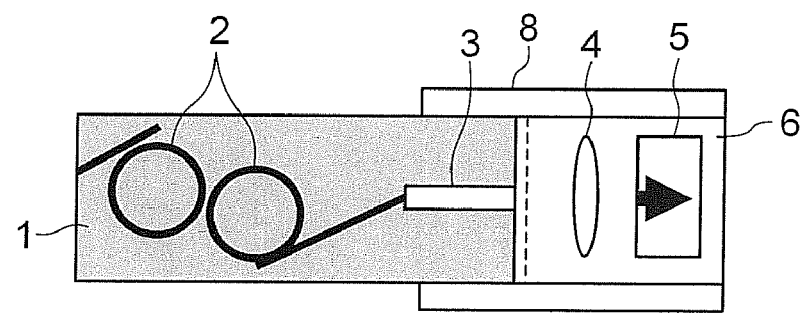
FIG. 2A is a plan view showing a configuration of an optical module according to a second exemplary embodiment of the present invention.
Figure 2B:
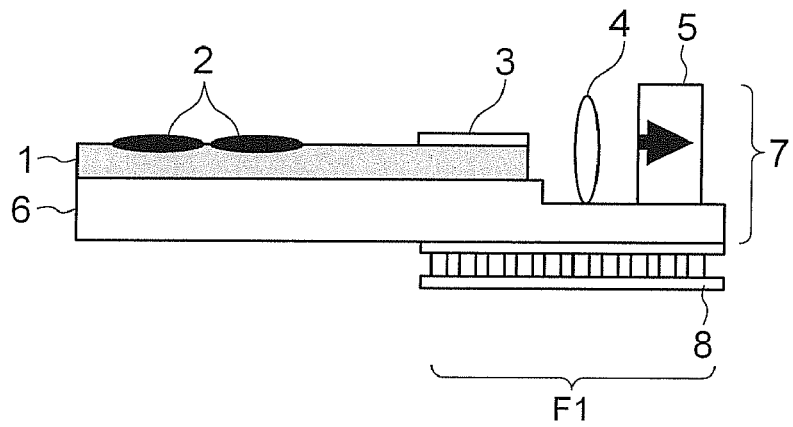
FIG. 2B is a front view showing the configuration of the optical module according to the second exemplary embodiment of the present invention.

As shown in FIGS. 2A and 2B, in the second exemplary embodiment of the present invention, the optical elements (2, 3) and the optical components (4, 5) of the optical element unit 7 are mounted on the heat conductive carrier 6, so that the heat resistance between the optical elements and the Peltier element 8 is lowered by the heat conductive carrier 6. Furthermore, in the second exemplary embodiment of the present invention, the Peltier element 8 is arranged only at the region F1 mounted with the optical components of the optical element unit 7, and the Peltier element 8 performs the temperature control of the optical element 2 through the region F1 mounted with the optical components of the optical element unit 7, similar to the first exemplary embodiment shown in FIG. 1.

In the second exemplary embodiment of the present invention, constant temperature control can be realized with room even if the heat value of the external resonator 2 is large since the heat resistance between the external resonator 2 which is the heat generating source and the Peltier element 8 is lowered by the heat conductive carrier 6. Furthermore, optical elements such as large lens 4 and isolator 5 can be mounted by adopting a configuration in which the PLC 1 is solder-mounted on the heat conductive carrier 6 having a thickness of a certain extent and the carrier 6 is solder-mounted on the Peltier element 8.

Third Exemplary Embodiment

In the case of the second exemplary embodiment shown in FIGS. 2A and 2B, the capacity of the Peltier element 8 needs to be increased when the heat value of the ring resonator 2 becomes larger, or in order to stabilize the constant temperature control in a high temperature environment.

Figure 3A:
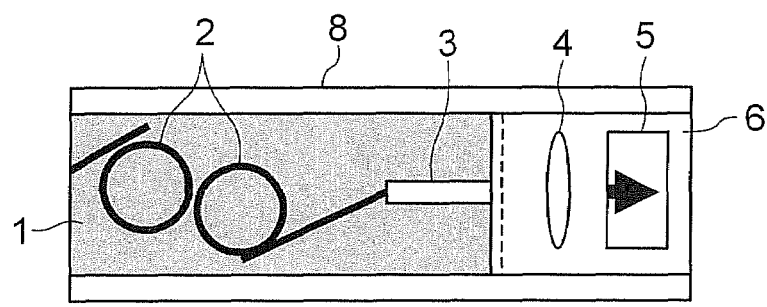
FIG. 3A is a plan view showing a configuration of an optical module according to a third exemplary embodiment of the present invention.
Figure 3B:
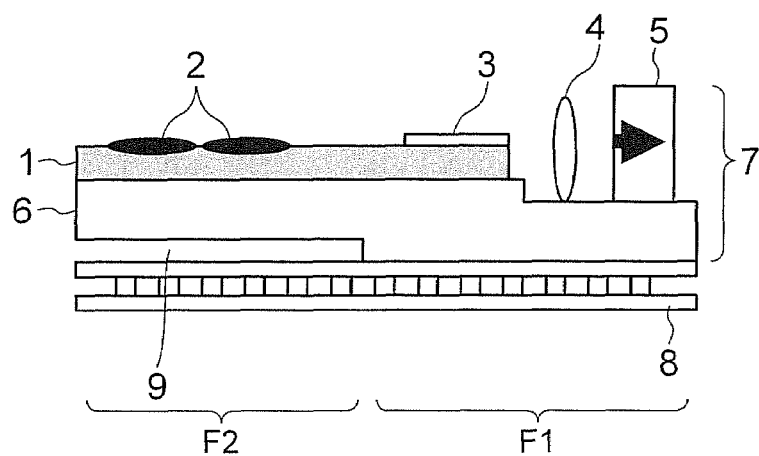
FIG. 3B is a front view showing the configuration of the optical module according to the third exemplary embodiment of the present invention.

As shown in FIGS. 3A and 3B, in the third exemplary embodiment of the present invention, one part of the Peltier element 8 is extended up to a region F2 mounted with the optical elements, and the Peltier element 8 is arranged at a state of being suspended with respect to the carrier 6 at the region F2 mounted with the optical element of the optical element unit 7, as denoted by reference number 9.

According to third exemplary embodiment of the present invention, the capacity of the Peltier element 8 can be increased since the Peltier element 8 is extended to below the ring resonator (optical element) 2, and thus the performance of temperature control by the Peltier element 8 can be enhanced, and it is possible to handle the large heat value of the ring resonator 2 sufficiently. Furthermore, since the Peltier element 8 is suspended with respect to the carrier 6 only at the portion below the ring resonator 2 so that the carrier and the Peltier element do not contact at below the ring resonator 2, thermal distortion by the Peltier element 8 will not influence the ring resonator 2 through the carrier 6.

Fourth Exemplary Embodiment

Figure 4A:
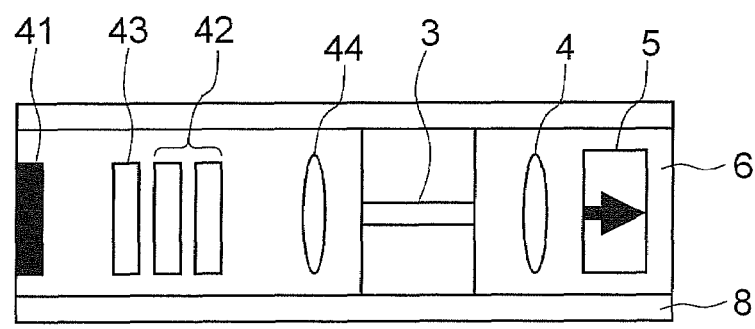
FIG. 4A is a plan view showing a configuration of an optical module according to a fourth exemplary embodiment of the present invention.
Figure 4B:
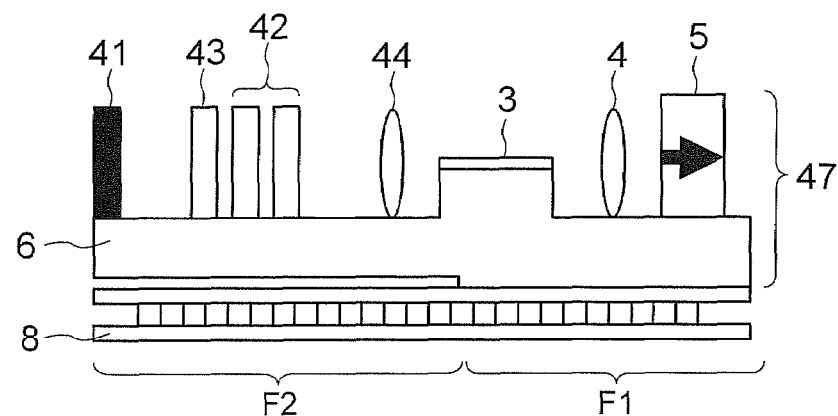
FIG. 4B is a front view showing the configuration of an optical module according to the fourth exemplary embodiment of the present invention.

Even in the wavelength variable light source module using the external resonator structure configured by a reflection mirror 41, an optical path length adjusting unit 43, and a wavelength selecting element 42, as shown in FIGS. 4A and 4B, in place of the PLC type ring resonator shown in FIGS. 1 and 2, when stress is applied to the external resonator configuration by the Peltier element 8, the optical path length varies whereby the wavelength varies.

As shown in FIGS. 4A and 4B, in the optical module according to the fourth exemplary embodiment of the present invention, an optical element unit 47 is configured by arranging, on the carrier 6, an external resonator configuration (optical element) configured by the reflection mirror 41, the wavelength selecting element 42 made of etalon etc. enabling wavelength tuning, and the optical path length adjusting unit 43 capable of adjusting the optical path length in place of the PLC type ring resonator 2 of the first exemplary embodiment shown in FIG. 1, where the optical element unit 47 is combined with the Peltier element 8 serving as the temperature control element to form a wavelength tunable light source module. In FIGS. 4A and 4B, the optical elements of the optical element unit 47 include the reflection mirror 41, the wavelength selecting element 42, and the optical path length adjusting unit 43. The optical components of the optical element unit 47 include the lens 4 and the isolator 5.

As shown in FIGS. 4A and 4B, in the fourth exemplary embodiment of the present invention, the Peltier element 8 is arranged at the region F1 mounted with the optical components of the optical element unit 47, one part of the Peltier element 8 is extended up to a region F2 mounted with the optical elements, and the Peltier element 8 is arranged at a state of being suspended with respect to the carrier 6 at the region F2 of the optical elements of the optical element unit 47.

According to fourth exemplary embodiment of the present invention, since a configuration in which the carrier is suspended only at the portion below the external resonator is used so that the carrier and the Peltier element do not contact at below the external resonator, the change in wavelength due to stress of the Peltier element can be alleviated even if the Peltier element is operated. Although the optical path length adjusting unit 43 is a heat control type, temperature control that does not depend on the environmental temperature can be performed on the optical path length adjusting unit 43 since the optical path length adjusting unit 43 is mounted on the heat conductive carrier 6 and is temperature controlled by the Peltier element 8 through the region F1.

Fifth Exemplary Embodiment

Figure 5:
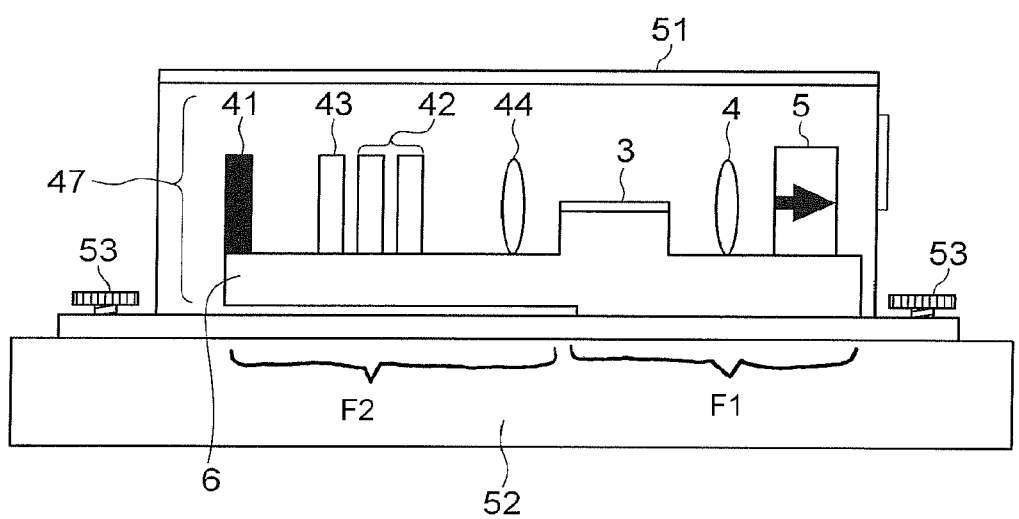
FIG. 5 is a longitudinal cross sectional view showing a configuration of an optical module according to a fifth exemplary embodiment of the present invention.

In order to operate the optical module according to the fourth exemplary embodiment shown in FIGS. 4A and 4B, the driving conditions thereof is required to be obtained in advance. Generally, a package 51 is fixed with a screw 53 to a heat sink 52 prepared by the manufacturer, as shown in FIG. 5, when operating the optical module to obtain the driving conditions. When fixed with the screw, even when the same package 51 is used, the applied stress may differ depending on the fixing torque, the order of tightening the screw, the surface state of the heat sink 52, the linear expansion coefficient and the Young's modulus of the heat sink 52. When stress is applied on the package 51, the stress also influences the optical element unit 47 arranged inside the package 51.

When the stress applied on the package 51 differs, the stress to be transmitted to the optical element unit 47 also differs, and thus the characteristics of the optical element unit 47 may change. This means that even if the optimum driving conditions are obtained by the manufacturer with the package 51 fixed on the test heat sink 52, the optimum conditions might differ even when fixed to the same heat sink 52 after the package 51 is detached from the test heat sink 52. That is, drive in the optimum state may not be realized in the driving conditions specified by the manufacturer in the commercial operation.

The optical module according to the fifth exemplary embodiment of the present invention thus has a configuration in which the external resonator is suspended from the package 51 so that the portion corresponding to the portion which is other than the portion of the external resonator configuration in the optical element unit 47 is joined and fixed with the package 51 so that stress applied to the package 51 is not directly transmitted to the external resonator that is sensitive to stress.

Specifically, as shown in FIG. 5, in the optical module according to the fifth exemplary embodiment of the present invention, the optical element unit 47 includes an external resonator configuration (optical element) configured by the reflection mirror 41, the wavelength selecting element 42 made of etalon etc. enabling wavelength tuning, and the optical path length adjusting unit 43 capable of adjusting the optical path length in place of the PLC type ring resonator 2 of the first exemplary embodiment shown in FIG. 1, where the optical element unit 47 is combined with the heat sink 52 serving as the temperature control element to form a wavelength tunable light source module. In FIG. 5, the optical elements of the optical element unit 47 include the reflection mirror 41, the wavelength selecting element 42, and the optical path length adjusting unit 43. The optical components of the optical element unit 47 include the lens 4 and the isolator 5.

Furthermore, as shown in FIG. 5, in the fifth exemplary embodiment of the present invention, the optical element unit 47 is arranged in the package 51, the optical element unit 47 is attached to the inner wall of the package 51 at the position of the region F1 mounted with the optical components, and the region F2 mounted with the optical elements of the optical element unit 47 is suspended from the inner wall of the package 51. The package 51 is attached to the heat sink 52. In FIG. 5, the package 51 is fixed to the heat sink 52 with the screw 53, but the package 51 may be attached to the heat sink 52 through a fixing method other than the screw 53.

According to the fifth exemplary embodiment of the present invention, the stress applied on the package 51 is prevented from being transmitted to the optical elements of the optical element unit 47 since the optical elements of the optical element unit 47 are suspended from the inner wall of the package 51, and thus characteristics of the optical element unit 47 will not be influenced even if stress is applied on the package. Therefore, when the manufacturer obtains the optimum driving conditions with the package 51 fixed to the test heat sink 52, the characteristics of the optical element unit at the time of shipment from the manufacturer can be exhibited even when the package 51 is attached to another heat sink 52. That is, drive can be realized in the optimum state at the driving conditions specified by the manufacturer in commercial operation.

Sixth Exemplary Embodiment

The capacity of the heat sink 52 in FIG. 5 sometimes needs to be increased. The capacity of the heat sink itself is increased in the example of FIG. 5, but the capacity is increased without changing the dimension of the heat sink 52 in the sixth exemplary embodiment of the present invention.

Figure 6:
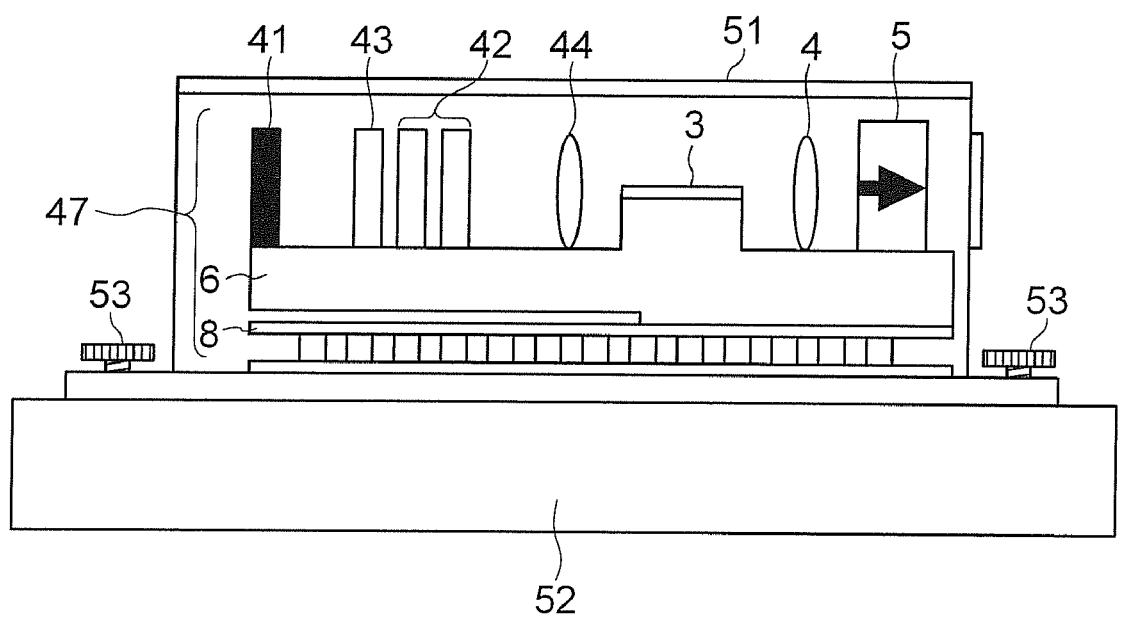
FIG. 6 is a longitudinal cross sectional view showing a configuration of an optical module according to a sixth exemplary embodiment of the present invention.

As shown in FIG. 6, in the sixth exemplary embodiment of the present invention, the optical element unit 47 shown in FIG. 5 is attached to the Peltier element 8 serving as a temperature control element at the position of the region F1 mounted with the optical components, the Peltier element 8 is attached to the inner wall of the package 51, and the optical element mounting region F2 of the optical element unit 47 is maintained at a state of being suspended from the Peltier element 8.

According to the present exemplary embodiment, since the optical elements of the optical element module sensitive to stress are suspended from the heat sink, the package, and the Peltier, element, the stress from the heat sink, the package, and the Peltier element is not directly transmitted to the optical elements of the optical element module, and the temperature of the optical element unit 47 can be controlled to be constant.

Similarly, even in the configuration in which the optical module according to the first, second, and third exemplary embodiments is mounted in the package 51, and the Peltier element 8 and the package 51 are joined and fixed, the stress from the heat sink 52 and the package 51 in addition to the stress from the Peltier element 8 are not directly transmitted to the ring resonator 2, and the temperature of the optical element unit 47 can be controlled to be constant.

Furthermore, according to the sixth exemplary embodiment of the present invention, the temperature control with respect to the optical elements of the optical element module can be performed more effectively since the heat sink and the Peltier element can both be used as the temperature control element.

In the above exemplary embodiments, the Peltier element 8 may be arranged in plurals if stress does not influence the optical elements of the optical element unit requiring temperature control. If a plurality of Peltier elements 8 is arranged, each Peltier element 8 is configured to perform the temperature control of the optical element through the region mounted with the optical components of the optical element unit. In this case as well, the Peltier element 8 is in a state of being suspended from the optical elements of the optical element unit.

Furthermore, the optical element unit 7/47 has been described as a wavelength tunable light source module in the above description, but the optical element unit is not limited thereto. The exemplary embodiments of the present invention is also applicable to the optical unit including array waveguide grating (AWG), tunable amplitude attenuator (VOA), or the like requiring temperature control by the temperature control element as optical elements. In the exemplary embodiments of the present invention, an active element such as SOA element 3 is employed as the optical component, but a passive element such as optical lens, optical fiber, or thin-film filter may be employed as optical components.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. An optical module comprising:
    a substrate;
    an optical element positioned over, and directly attached to, a first portion of the substrate, the optical element comprising an optical resonator to tunably control a resonance frequency, the optical resonator being susceptible to stress, and the optical resonator requiring temperature control; and,
    a temperature control element positioned under, and directly attached to, only a second portion of the substrate,
    wherein the first portion of the substrate does not overlap the second portion of the substrate, and the temperature control element is not positioned under or directly attached to the first portion of the substrate.

2. The optical module according to claim 1, wherein the temperature control element is such that distortional stress occurs at the second portion of the substrate, and wherein the optical element is such that the optical element is at least substantially unaffected by the distortional stress as a result of the temperature control element being positioned over the second portion of the substrate and as a result of the first portion of the substrate not overlapping the second portion of the substrate.

3. The optical module according to claim 1, wherein the substrate is mounted on a heat conductive carrier.

4. The optical module according to claim 1, wherein the optical element is mounted in a package.

5. The optical module according to claim 4, wherein the substrate is in contact with an inner wall of the package at the second portion, and the substrate is suspended from the inner wall of the package at the first portion.

6. The optical module according to claim 5, wherein the package is attached to a heat sink.

7. The optical module according to claim 4, further comprising a temperature control element mounted on an inner wall of the package,
   wherein the substrate is in contact with the temperature control element at the second portion, and the substrate is suspended from the temperature control element at the first portion.

8. The optical module according to claim 7, wherein the package is attached to a heat sink.

9. The optical module according to claim 1, wherein the temperature control element is a Peltier element.

10. The optical module according to claim 1, wherein the optical element has a configuration in which an optical waveguide and the optical element are integrated as hybrid integration.

11. The optical module according to claim 1, wherein the optical element includes a ring resonator configured by an optical waveguide.

12. The optical module according to claim 1, wherein the optical resonator includes a wavelength selecting element for transmitting light of a specific wavelength, and an optical path length adjusting unit for adjusting an optical path length.

* * * * *